United States Patent [19]

Catrambone et al.

[11] Patent Number: 6,078,501

[45] Date of Patent: Jun. 20, 2000

[54] POWER SEMICONDUCTOR MODULE

[75] Inventors: John Catrambone, Carlisle; David Doiron, Ashburnham; Jay Greenspan, South Dartmouth; William Driscoll, Westford, all of Mass.; Christopher Clarke, Nashua, N.H.; Boris Semenov, Southborough, Mass.

[73] Assignee: Omnirel LLC, Leominster, Mass.

[21] Appl. No.: 09/215,580

[22] Filed: Dec. 17, 1998

Related U.S. Application Data

[63] Continuation-in-part of application No. 08/995,308, Dec. 22, 1997.

[51] Int. Cl.$^7$ ....................................... H05K 7/20
[52] U.S. Cl. .................. 361/704; 361/707; 361/715; 361/728; 361/736; 361/772; 174/50; 174/50.5; 174/50.51; 174/50.54; 174/50.56; 174/52.3; 174/52.4; 257/712; 257/717
[58] Field of Search .................................. 361/728, 736, 361/748, 752, 760, 765, 772, 774, 777, 778, 730, 704, 707, 715; 174/50, 50.51, 50.54, 50.6, 52.1, 52.2; 257/687, 706, 713, 787, 796; 165/80.3, 185

[56] References Cited

U.S. PATENT DOCUMENTS

| | | | |
|---|---|---|---|
| 5,291,065 | 3/1994 | Arai et al. | 257/723 |
| 5,408,128 | 4/1995 | Furnival | 257/690 |
| 5,424,579 | 6/1995 | Arai et al. | 257/690 |
| 5,463,251 | 10/1995 | Fujita et al. | 257/717 |
| 5,523,620 | 6/1996 | Eytcheson et al. | 257/690 |
| 5,625,536 | 4/1997 | Soyano et al. | 361/736 |
| 5,761,046 | 6/1998 | Hein et al. | 361/752 |
| 5,901,044 | 5/1999 | Marro | 361/728 |
| 5,920,119 | 7/1999 | Tamba et al. | 257/718 |

FOREIGN PATENT DOCUMENTS

| | | |
|---|---|---|
| 0 116 289 A2 | 8/1984 | Japan . |
| 407 014 948 | 1/1995 | Japan . |
| 407 058 282 | 1/1995 | Japan . |
| 410 116 962 | 5/1998 | Japan . |

*Primary Examiner*—Leo P. Picard
*Assistant Examiner*—Boris L. Chervinsky
*Attorney, Agent, or Firm*—Weingarten, Schurgin, Gagnebin & Hayes LLP

[57] ABSTRACT

An electronic module or package is disclosed for providing high reliability and high performance operation. The package comprises a hermetically sealed enclosure having a metallic baseplate and a ceramic cover, and containing one or more circuits or devices therein which typically are power rectifiers, bridges or power control circuitry. One or more power terminals are disposed on a terminal block compliantly supported on or above the baseplate, the terminals extending through the cover in hermetically sealed manner. Signal or control terminals may also be disposed on a terminal block compliantly supported on or above the baseplate, these terminals also extending through the cover in hermetically sealed manner. An adapter plate may be mounted on the cover and containing a plurality of terminals connected to the module terminals. The terminals of the adapter plate can be in any configuration to suit user requirements without requiring a change in the terminal configuration of the module itself. The adapter plate may also contain active and/or passive circuitry.

18 Claims, 8 Drawing Sheets

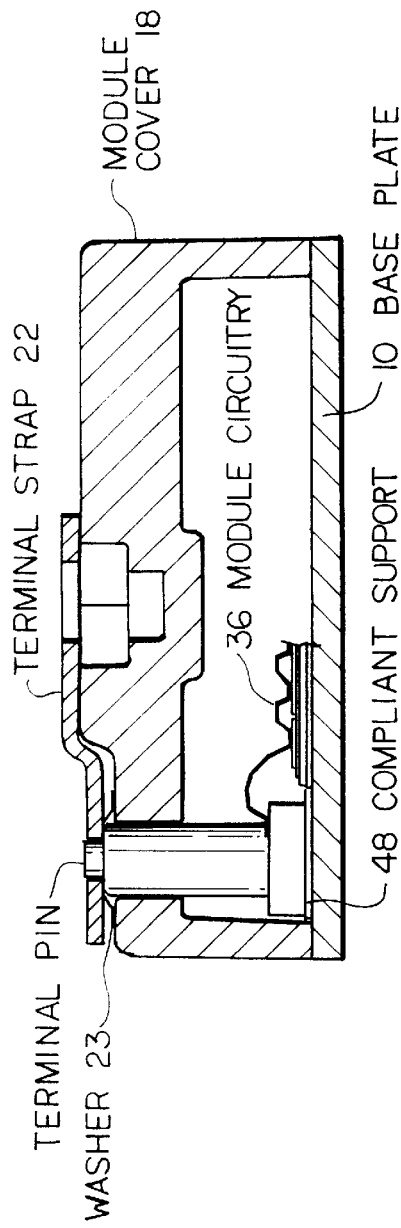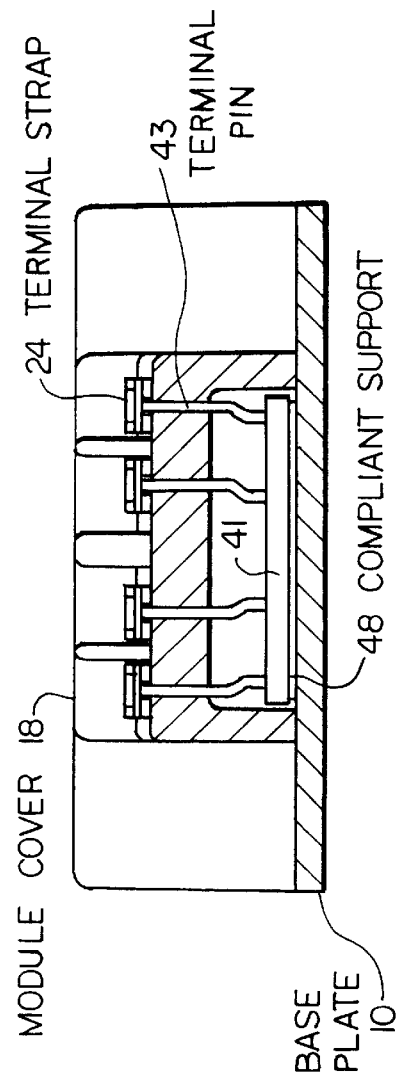

POWER SEMICONDUCTOR MODULE

CROSS REFERENCE TO RELATED APPLICATIONS

This application is a continuation in part of application Ser. No. 08/995,308 filed Dec. 22, 1997.

STATEMENT REGARDING FEDERALLY SPONSORED RESEARCH OR DEVELOPMENT

NONE

FIELD OF THE INVENTION

This invention relates to electronic packages and more particularly to modular electronic power packages.

BACKGROUND OF THE INVENTION

Electronic power packages or modules are generally known for providing electrical power to circuits and devices such as motors, actuators, controllers and the like. For applications requiring high reliability the module is preferably hermetically sealed to prevent infiltration of moisture, dust or other contaminants into the module interior which can cause impairment or failure of the module. Hermetically sealed modules are usually of sufficient high cost to limit their use for many commercial and industrial applications where cost is a significant factor. It would be desirable to provide a high reliability and relatively low cost module for high performance industrial, commercial and other applications.

BRIEF SUMMARY OF THE INVENTION

In brief the present invention provides an electronic module or package for providing high reliability and high performance and which can be manufactured at relatively low cost. The package comprises a hermetically sealed enclosure having a metallic baseplate and a ceramic cover, and containing circuits which are typically comprised of active and passive electronic components in various circuit configurations which may include power switching elements, as well as drive, supervisory and control circuitry. One or more power terminals are disposed on a terminal block compliantly supported on the baseplate, the terminals extending through the cover in hermetically sealed manner. Signal or control terminals may also be disposed on a terminal block compliantly supported on the baseplate, these terminals also extending through the cover in hermetically sealed manner. Alternatively, one or more power terminals can be compliantly supported above the baseplate and retained in position by attachment to the cover and external terminals.

According to one aspect of the invention, an adapter plate is mounted on the cover and contains a plurality of terminals connected to the module terminals. The terminals of the adapter plate can be in any configuration to suit user requirements without requiring a change in the terminal configuration of the module itself. The adapter plate may also contain active and/or passive circuitry.

According to another aspect of the invention, a circuit board is disposed within the module and contains control or other circuitry or devices appropriate to the particular module implementation.

BRIEF DESCRIPTION OF THE SEVERAL VIEWS OF THE DRAWING

The invention will be more fully understood from the following detailed description read in conjunction with the drawing, in which:

FIGS. 2 and 3 are respective cutaway side views of the module of FIG. 1;

DETAILED DESCRIPTION OF THE INVENTION

Figure 1:
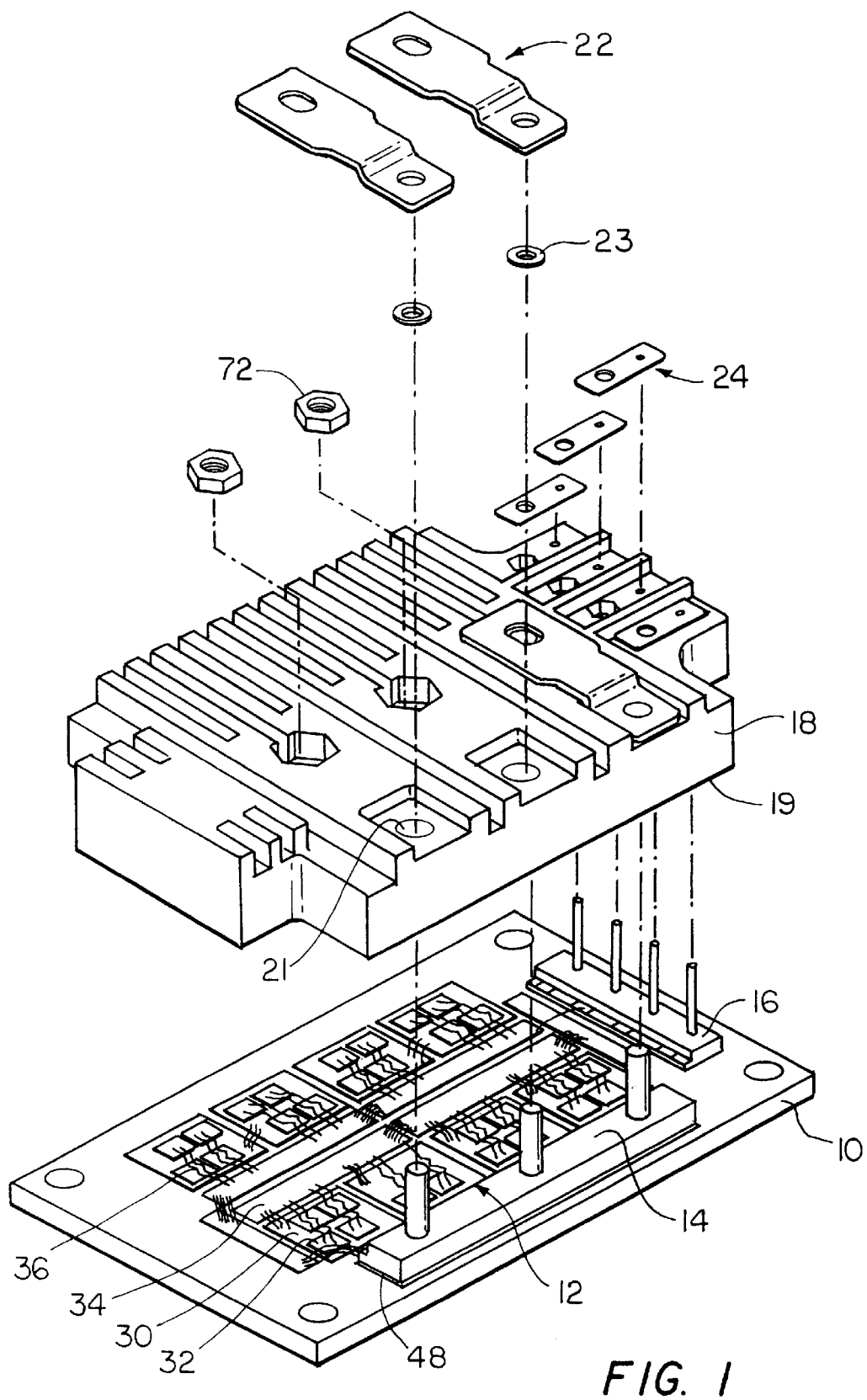
FIG. 1 is an exploded pictorial view of a power semiconductor module in accordance with the invention.

A high power semiconductor package or module in accordance with the invention is shown in FIGS. 1–3 includes a baseplate 10 having one or more electronic circuits or devices 12 disposed on a surface thereof, a first terminal block 14 disposed along a side edge of the baseplate and a second terminal block 16 disposed along an end edge of the baseplate, and an electrically insulating cover 18 attachable to the baseplate and enclosing the circuits 12 and terminal blocks 14 and 16.

The high power package or module embodying the invention is intended for high reliability applications in the fields of aerospace and industry. The module has a temperature range from minus 55° C. to 150° C. and power ratings up to 3000 amps and up to 4500 volts. The module can achieve hermeticity and meet fine leak hermeticity testing standards such as MIL-STD-883E method 1014.

The baseplate 10 is of a material which has good thermal conductivity, a thermal coefficient of expansion which is compatible with the substrates of the circuits or devices 12 disposed thereon, and also compatible with the cover 18 which is sealed to the baseplate. The baseplate is made of a laminate or composite of metallic materials in a combination to achieve the requisite thermal conductivity and thermal coefficient of expansion. The metallic materials typically include copper, copper tungsten, copper molybdenum, copper alloys or aluminum silicone carbide. The surface of the baseplate 10 may be plated to facilitate attachment of the substrates thereon as is known in the art. The plating may be on the entire surface of the baseplate or only in those areas where the substrates are to be attached.

Referring again to FIG. 1, each of the circuits 12 is typically a hybrid circuit or high power device attached to or formed on a ceramic substrate 30 which includes one or more contact areas 32. The contact areas are connected to contact areas 34 provided on the baseplate by one or more wire bonds or current straps 36. The number of wire bonds or current straps connecting particular contact areas 32 to associated contact area 34 is selected to accommodate the current to be carried between those contacts areas. The contact areas 32 of a circuit substrate 30 can also be wire bonded directly to contact areas of a terminal block.

In the illustrated embodiment two terminal blocks 14 and 16 are shown. The terminal block 14 provides terminals for carrying relatively high power, and the terminal block 16 provides terminals for carrying relatively lower power such as for control and signal purposes. Referring to FIGS. 4A–4E the terminal block includes a body 40 of electrically insulating plastic or other material having conductive terminals 42 retained therein. Typically the terminals are molded into the body. The terminals each include a post portion 44 outwardly extending from the body 40 in a array, and a flat shelf portion 46 which is disposed generally at a right angle to the post portion 44. The shelf portion is disposed on a laterally extending portion of the body 40, as shown, which serves as a support for the shelf portions of the terminals.

Figure 4A:
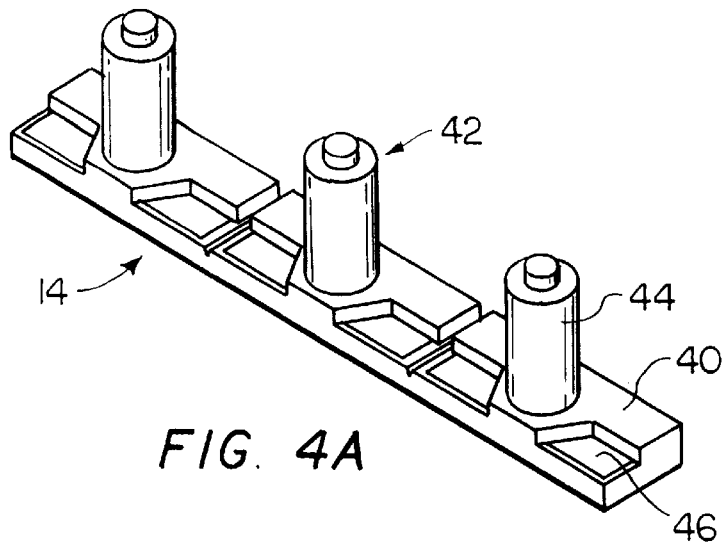
FIGS. 4A, and 4B are pictorial and top views respectively of the power block employed in the embodiment of FIG. 1.
Figure 4B:
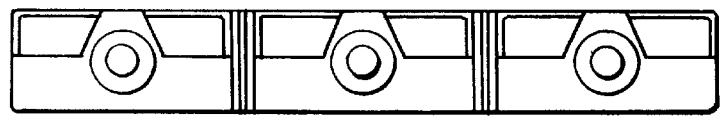
Figure 4E:
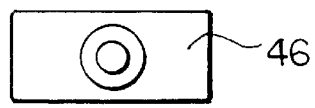
FIGS. 4C, 4D and 4E are views of the terminal post assembly employed in the terminal block of FIGS. 4A and 4B.
Figure 4C:
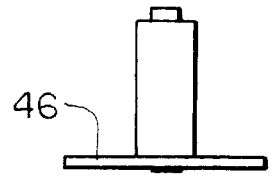
Figure 4D:
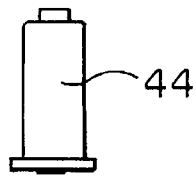
Figure 5A:
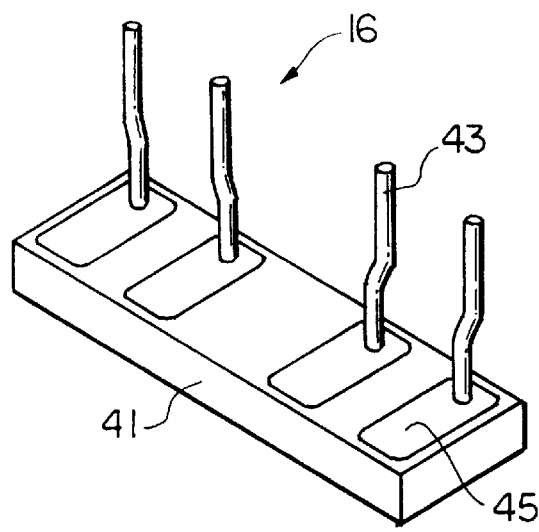
FIGS. 5A and 5B are pictorial and top views respectively of the control terminal block employed in the embodiment of FIG. 1.
Figure 5B:
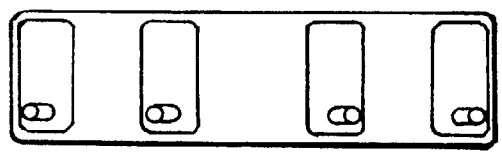
Figure 5C:
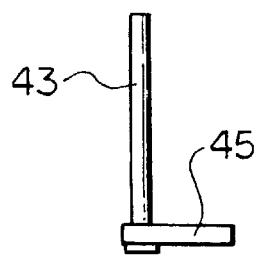
FIGS. 5C and 5D are views of the terminal post assembly employed in the terminal block of FIGS. 5A and 5B.
Figure 5D:
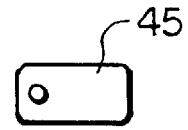

In the illustrated embodiment the conductive terminal 42, which typically is copper, is fabricated as shown in FIGS. 4C–4E and then molded into body 40. As seen in FIGS. 4C–4E, the post portion 44 is brazed or otherwise attached to the flat shelf portion 46 and this assembly is molded to body 40 to complete the assembly of the terminal block.

The terminal block 16 is more particularly illustrated in FIGS. 5A–5D, and is similar in construction to the terminal block 14 illustrated in FIG. 4 above. The terminal block 16 includes a plastic or other electrically insulating body 41 having conductive terminal posts 43, each attached to a conductive shelf portion 45. Each conductive post 43 is brazed or otherwise attached to conductive shelf portion or plate 45, and this assembly is molded into body 41 to provide the completed terminal block structure.

As shown in FIGS. 1–3, the body of the terminal blocks 14 and 16 are each attached to the confronting surface of the baseplate 10 by a compliant material 48 which typically is a silicone rubber. The compliant layer is bonded to the body 40 and to the baseplate by a suitable adhesive such as epoxy. Wire bonds or current straps 36 are provided to electrically connect the shelf portion 46 of each terminal to an intermediate contact area 34 or directly to a contact area 32 of a circuit substrate 30. The compliant material 48 accommodates thermal expansion and contraction of the terminal block and baseplate and minimizes stress on the terminal block which could cause the block to separate from the baseplate or to crack or otherwise fail.

The terminal blocks are of a size and configuration to suit the performance requirements of particular implementations. In the illustrated embodiments the terminals include cylindrical post portions which may or may not be threaded. The post portions may be of other than cylindrical shape. It will also be recognized that the size of the post portions can be selected to accommodate the power requirements of the terminal and module in which it is employed as well as the mechanical characteristics desired for a particular instance. Similarly the shelf portions 46 of the terminals can be sized to accommodate the number of wire bonds or straps intended for a particular device and to provided intended mechanical properties.

The cover 18 is preferably a ceramic material such as alumina having a metalized edge 19 which is bonded to the confronting surface of baseplate 10 to hermetically enclose the terminal blocks and circuitry. Referring to FIGS. 1 and 2, the terminal posts extend through openings 21 provided in the top wall of the cover, and a washer or ring 23 typically of non-ferrous material is disposed around the upstanding end of the terminal post. Flat terminals 22 are disposed within respective recessed areas of the cover, as illustrated, and each have an opening to accommodate the outer end of the respective terminal posts of terminal block 14.

In similar manner, as shown in FIGS. 1 and 3, flat terminals 24 are disposed within respective recessed areas of the cover and have openings to accommodate the outer end of the terminal posts of terminal block 16. The terminal posts are soldered, brazed or otherwise bonded to the washers 23 and terminals 22 to provide a hermetically sealed package. Hex nuts 72 can be disposed or retained within respective hexagonal openings in cover 18. The hex nuts can receive threaded terminals for electrical connection to associated circuitry or apparatus. These hex nuts can also serve for the mounting of an adapter plate as described below. The cover shown has a ribbed construction to provide physical separation between the terminals for greater electrical isolation and satisfy various governing agency requirements such as Underwriter's Laboratory (U.L.) specifications.

In the embodiments described above, the cover 18 is a single piece which is hermetically sealed to the confronting baseplate. Alternatively the cover can be formed of two or more elements such as a wall of one material and a top plate of the same or different material which are bonded together to form the cover unit. This construction can offer the benefits of lower manufacturing cost and simplicity for certain applications.

Figure 6:
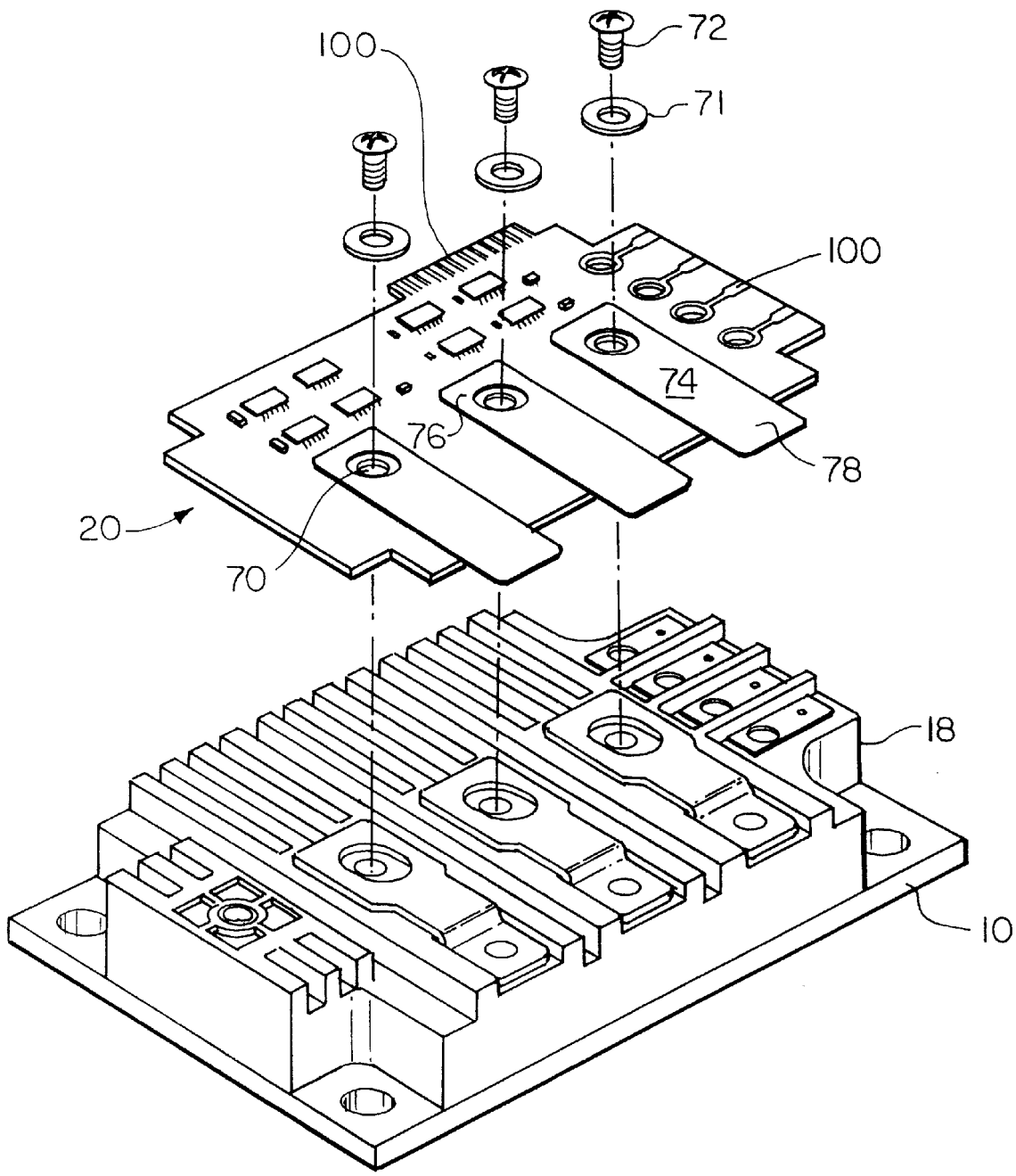
FIG. 6 is an exploded pictorial view of the embodiment of FIG. 1 illustrating an adapter plate.

An adapter plate can be mounted on the upper surface of the cover as illustrated in FIG. 6. The adapter plate allows placement of the electrical terminals in any configuration desired to suit user requirements. By virtue of this feature, a module can be constructed having a standardized terminal arrangement, such as that shown in FIG. 1, to minimize the need for stocking and fabricating various versions having different terminal arrangements while still providing package terminations to suit a user's requirements. The adapter plate 20 is typically made of an electrically insulating material such as a plastic or a printed circuit board material having openings to accommodate the hardware to be disposed thereon. In the illustrated embodiment of FIG. 2, three openings 70 are shown to accommodate respective machine screws 72 and washers 71. Three flat terminals 74 have first ends 76 with openings aligned with the openings 70, and outer ends 78 configured to mate with an associated connector. The adapter plate can be retained on the module by fasteners such as machine screws 72, or by an adhesive or other retention elements.

The terminal configuration illustrated provides three power terminals generally disposed along the module and four signal or control terminals disposed along one of the shorter sides of the module. Other terminal configurations can be readily provided by an adapter plate which has transitional connections between the terminals of the module accessible on the upper surface of the cover and the terminal positions in intended position on the upper surface of the adapter plate.

The adapter plate may extend beyond the periphery of the cover, such as along one or more edges of the cover. In one version shown on FIG. 6, edge terminals 100 can be provided along one or more edges of the adapter plate for connection to external circuitry. The adapter plate can have circuit traces or circuit elements thereon as shown in FIG. 6. The adapter plate can itself be part of a power control board or a portion of such a power control board.

Figure 7:
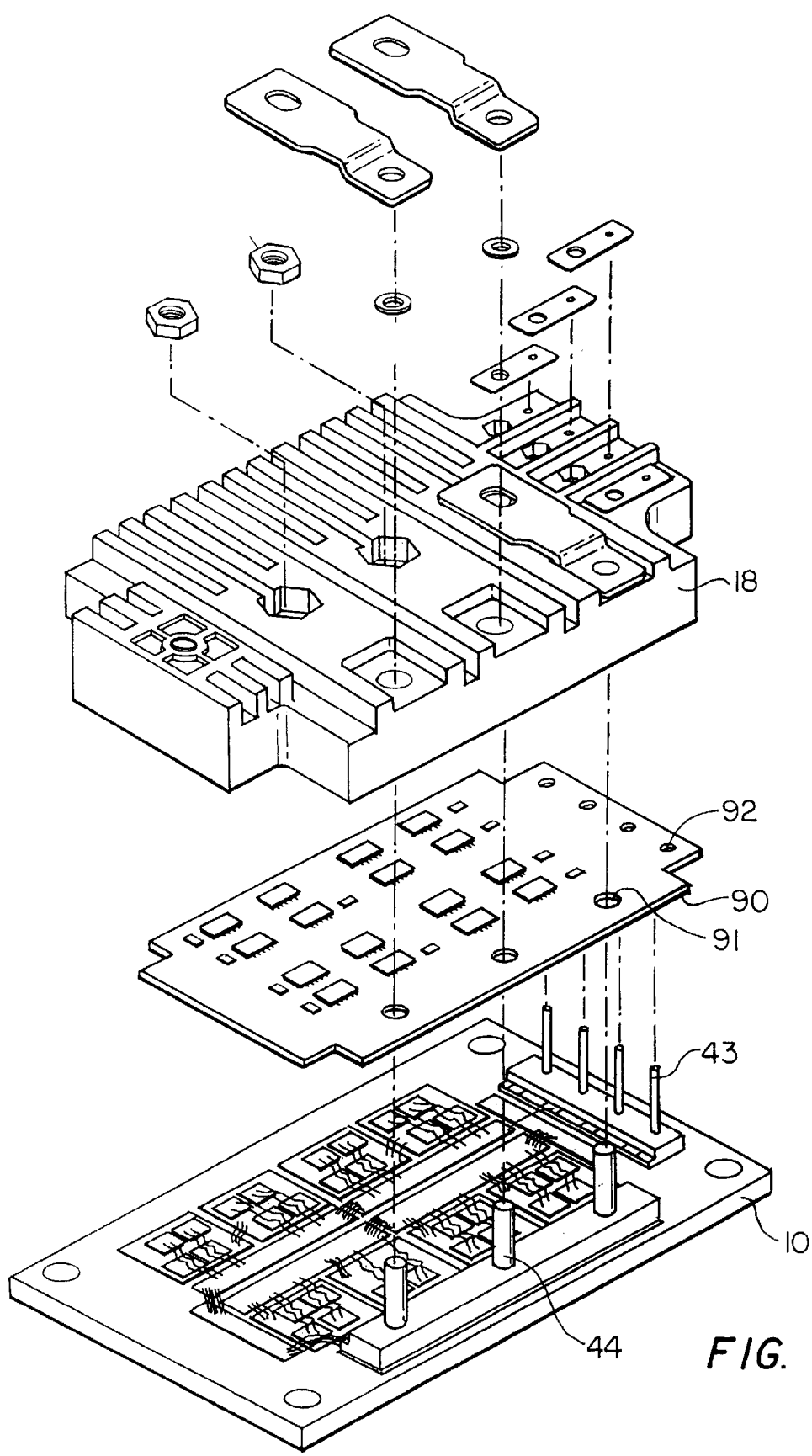
FIG. 7 is an exploded pictorial view of a power semiconductor module in accordance with the invention and having an internal circuit board.

In another embodiment of the invention, illustrated in FIG. 7, a circuit board 90 is mounted within the module and can contain circuitry or components appropriate to the functionality of the particular module implementation. The circuit board 90 has openings 91 and 92 to accommodate the respective terminal posts 44 and 43. The board 90 is retained in a position within the module spaced from the inner surface of baseplate 10 by any suitable means known in the art. As an example, the circuit board 90 can be retained solely by the terminal posts 43 and 44 to which the board can be bonded, or the board may be spaced from the confronting surface of the baseplate 10 by standoffs or other hardware elements.

Figure 8:
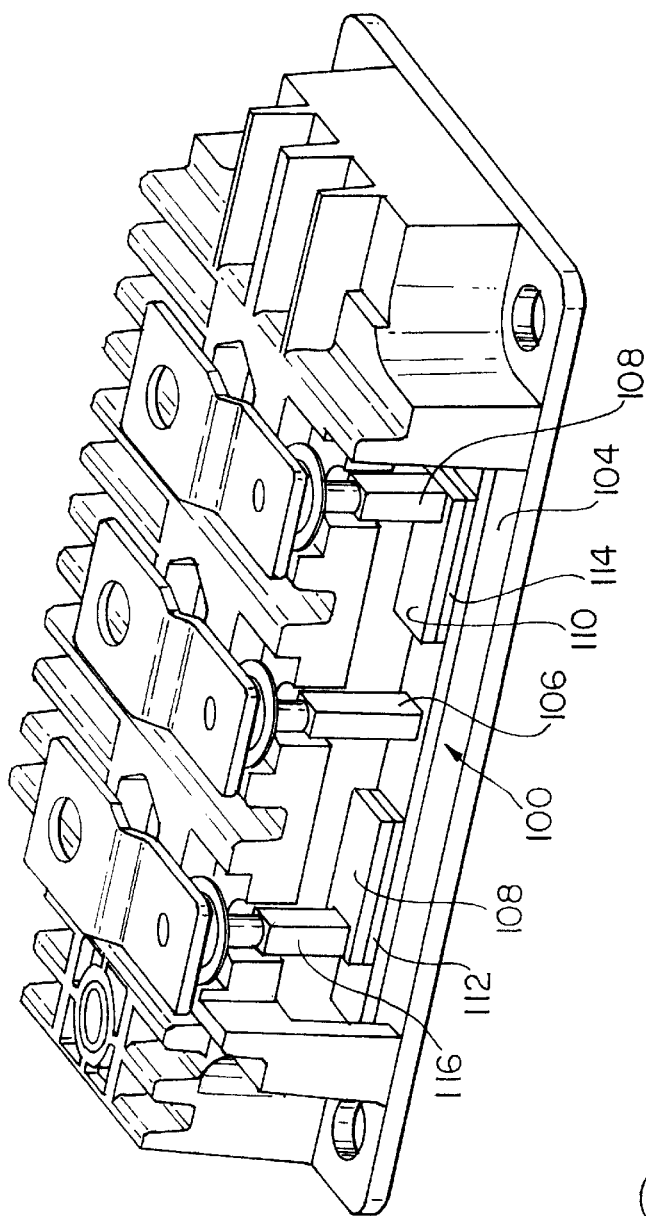
FIG. 8 is a pictorial view of an alternative embodiment of a power semiconductor module in accordance with the invention.
Figure 9:
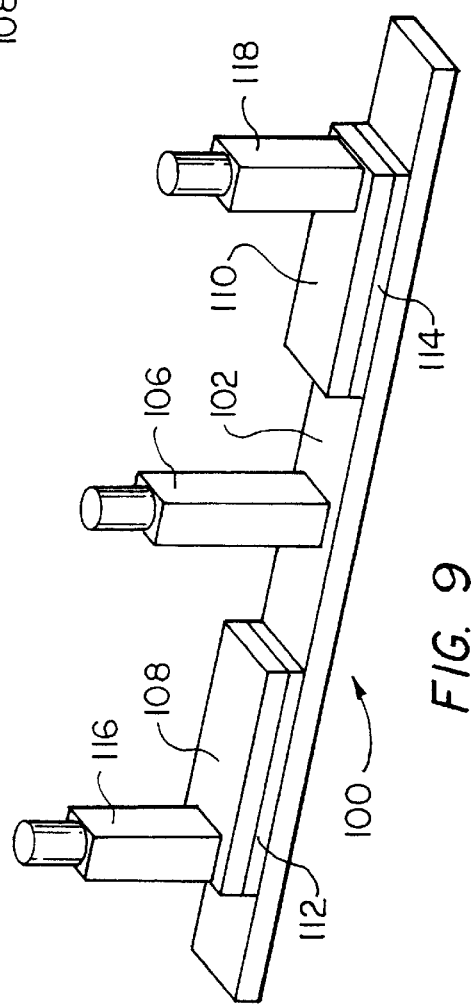
FIG. 9 is a pictorial view of the terminal block of FIG. 8.
Figure 10:
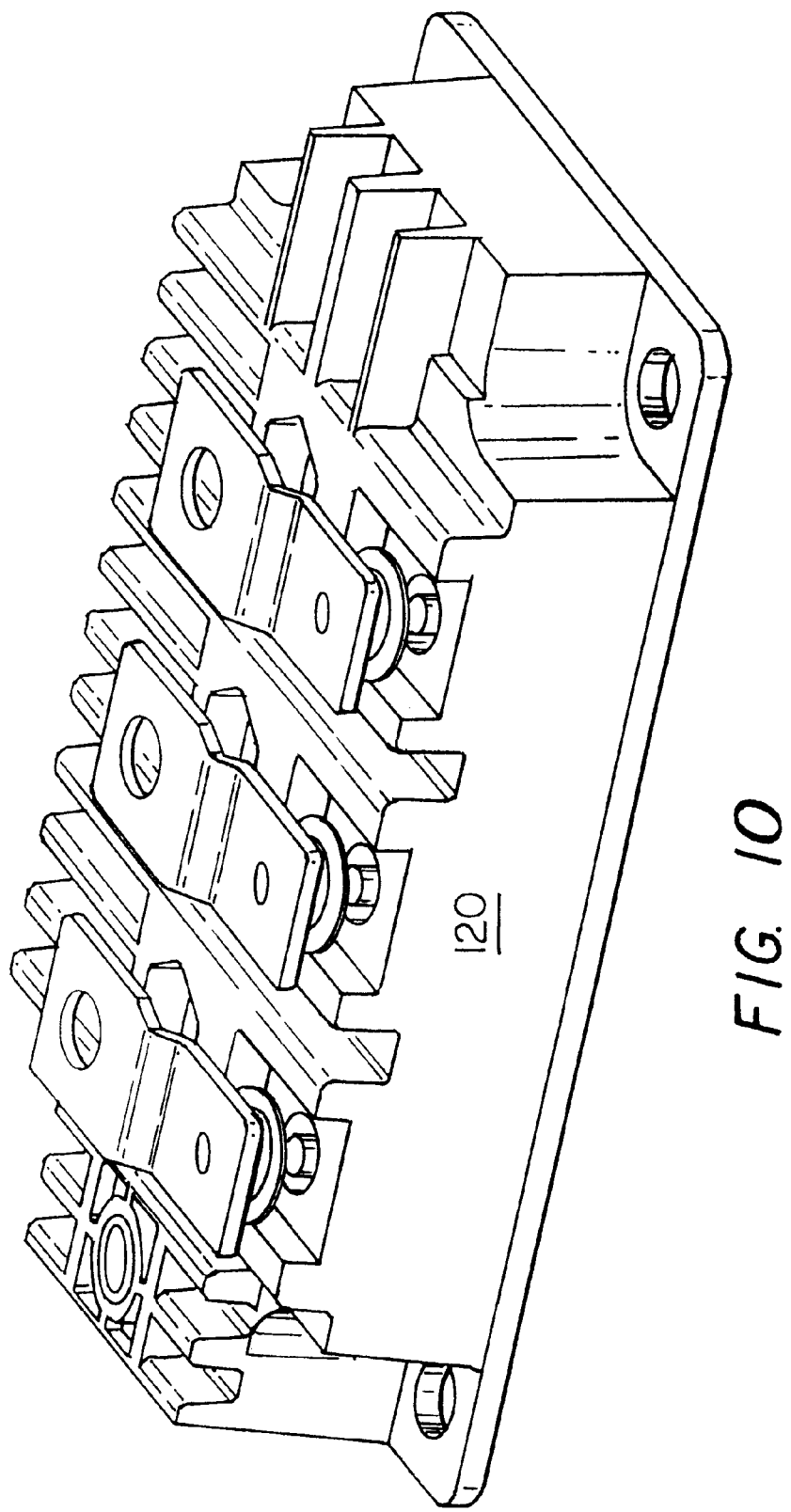
FIG. 10 is a pictorial view of the embodiment of FIG. 8 illustrating the cover installed.

A further embodiment of the invention is illustrated in FIGS. 8–10.

The terminal block 100 includes a conductive plate 102 mounted on the baseplate 104. A terminal post 106 is affixed and upstanding from the plate 102. Smaller terminal blocks 108 and 110 are mounted on ceramic plates 112 and 114, respectively, which in turn are mounted on the upper surface of plate 102. Terminal posts 116 and 118 are affixed to and upstanding from respective terminal blocks 108 and 110. The terminal blocks are connected to appropriate portions of the circuitry of the module by current straps or wire bonds as in the above embodiments.

The plate 102 is removably attached to the baseplate 104 by a suitable adhesive such that the terminal block 100 can be separated from the underlying baseplate 104 after bonding of the current straps and before installation of the module cover. The cover 120 (FIG. 10) is installed onto the baseplate 104 with the terminal posts 106, 116 and 118 extending through respective openings in the cover. The terminal posts are soldered or otherwise connected to the terminals and hermetically sealed to the cover during which step the terminal block is pulled upward away from the baseplate to provide a space between the bottom surface of the plate 102 and confronting surface of the baseplate 104. Terminal block 100 is thereby resiliently supported on the module to accommodate thermal expansion and contraction of the terminal block and baseplate and to minimize stress on the terminal block which could result from the block being rigidly attached to the baseplate.

The terminal posts in the illustrated embodiment of FIGS. 8–10 are of rectangular cross-section having an upper cylindrical end. The cylindrical end is sized to mate with and be bonded to the ring seal and opening at the end of the external terminal.

The invention is not to be limited by what has been particularly shown and described as alternative implementations and modifications may occur to those versed in the art without departing from the spirit and true scope of the invention as set forth in the claims.

What is claimed is:

1. A power semiconductor module comprising:
   a baseplate supporting one or more electronic devices on a surface thereof;
   at least one terminal block having one or more power terminals retained thereon and having outwardly extending terminal elements;
   a compliant mounting for compliantly supporting the terminal block on the same surface of the baseplate as the electronic devices; and
   a cover hermetically sealed to the baseplate and having an opening for each of the terminal elements, each of the terminal elements extending through the cover and being hermetically sealed thereto.

2. The invention of claim 1 wherein the baseplate is composed of a laminate of metallic materials to provide a predetermined thermal conductivity and thermal coefficient of expansion.

3. The invention of claim 1 including a sealing element for each of the terminals each sealing element being operative to hermetically seal the respective terminal to the cover.

4. The invention of claim 1 further including an adapter plate mountable on the top surface of the cover and containing one or more terminals each connected to a respective terminal extending through the cover.

5. The invention of claim 1 wherein the baseplate is a thermally conductive material having a thermal coefficient of expansion compatible with that of the cover and of the electronic devices mounted on a surface of the baseplate.

6. The invention of claim 5 wherein the cover is a ceramic material.

7. The invention of claim 1 further including a circuit board disposed within the module in spaced relation to the baseplate and containing one or more electronic devices on at least one surface thereof.

8. The invention of claim 4 wherein the adapter plate is electrically insulative and has at least a portion of one side extending beyond the periphery of the cover and containing one or more edge terminals.

9. The invention of claim 4 wherein the adapter plate is electrically insulative and has circuit traces or circuit elements thereon.

10. The invention of claim 1 wherein the baseplate is composed of a composite of metallic materials to provide a predetermined thermal conductivity and thermal coefficient of expansion.

11. A power semiconductor module comprising:
    a baseplate of thermally conductive metallic material having one or more electronic device substrates mounted on a surface thereof;
    at least one high power terminal block having one or more power terminals retained thereon each terminal including an outwardly extending post portion and a laterally extending shelf portion;
    at least one low power terminal block having one or more power terminals retained thereon each terminal including an outwardly extending post portion and a laterally extending shelf portion;
    a compliant mounting for each of said terminal blocks for compliantly supporting the respective terminal blocks on the surface of the baseplate;
    electrical connections selectively connecting the shelf portions of the terminal blocks to the electronic devices; and
    a cover hermetically sealed to the baseplate and having an opening for each of the terminal posts, each of the terminal posts being hermetically sealed to the cover.

12. The invention of claim 11 wherein the compliant mounting includes a layer of compliant material bonded to the terminal block and to the surface of the baseplate.

13. The invention of claim 12 wherein the compliant material is silicone rubber.

14. The invention of claim 12 including electrical terminal elements disposed on an outer surface of the cover and electrically connected to respective terminals.

15. The invention of claim 11 wherein each of the terminal blocks include a body of electrically insulating material having the terminals molded thereto.

16. A power semiconductor module comprising:
    a baseplate supporting one or more electronic devices on a surface thereof;

at least one terminal block having one or more power terminals retained thereon and having outwardly extending terminal elements;

a compliant mounting for compliantly supporting the terminal block spaced from the same surface of the baseplate as the electronic devices; and a cover hermetically sealed to the baseplate and having an opening for each of the terminal elements, each of the terminal elements extending through the cover and being hermetically sealed thereto.

17. A power semiconductor module comprising:

a baseplate of thermally conductive metallic material having one or more electronic device substrates mounted on a surface thereof;

at least one high power terminal block having one or more power terminals retained thereon each terminal including an outwardly extending post portion and a laterally extending shelf portion;

at least one low power terminal block having one or more power terminals retained thereon each terminal including an outwardly extending post portion;

a compliant mounting for said high power terminal block for compliantly supporting that terminal block above the surface of the baseplate;

electrical connections selectively connecting the terminal blocks to the electronic devices; and a cover hermetically sealed to the baseplate and having an opening for each of the terminal posts, each of the terminal posts being hermetically sealed to the cover.

18. The invention of claim 12 wherein the compliant mounting includes for each terminal, an electrically insulative spacer bonded to the surface of the shelf portion.

* * * * *